US009658669B2

(12) United States Patent
Wang et al.

(10) Patent No.: US 9,658,669 B2
(45) Date of Patent: May 23, 2017

(54) SOLID-STATE MASS STORAGE DEVICES WITH CAPACITOR-BASED POWER SUPPLY AND METHODS OF OPERATION

(71) Applicant: OCZ Storage Solutions Inc., San Jose, CA (US)

(72) Inventors: Wenwei Wang, San Jose, CA (US); Ilya Shlimenzon, San Jose, CA (US)

(73) Assignee: Toshiba Corporation, Tokyo (JP)

( * ) Notice: Subject to any disclaimer, the term of this patent is extended or adjusted under 35 U.S.C. 154(b) by 0 days.

(21) Appl. No.: 14/867,157

(22) Filed: Sep. 28, 2015

(65) Prior Publication Data

US 2017/0090538 A1     Mar. 30, 2017

(51) Int. Cl.
  *G06F 1/26*     (2006.01)
  *G06F 1/32*     (2006.01)
  *G06F 1/30*     (2006.01)

(52) U.S. Cl.
  CPC ............... *G06F 1/266* (2013.01); *G06F 1/30* (2013.01); *G06F 1/32* (2013.01); *G06F 1/3203* (2013.01); *G06F 1/3275* (2013.01)

(58) Field of Classification Search
  CPC ......... G06F 1/32; G06F 1/3203; G06F 1/3275
  USPC ................................. 713/300, 320, 323, 330
  See application file for complete search history.

(56) References Cited

U.S. PATENT DOCUMENTS

| | | |
|---|---|---|
| 7,661,002 B2 | 2/2010 | Pecone et al. |
| 8,065,562 B2 | 11/2011 | Wilson et al. |
| 8,358,109 B2 | 1/2013 | Gunderson |
| 8,468,370 B2 | 6/2013 | Miller et al. |
| 8,479,032 B2 | 7/2013 | Trantham et al. |
| 8,607,076 B2 | 12/2013 | Lester et al. |
| 8,656,072 B2 | 2/2014 | Hinkle et al. |
| 8,745,421 B2 | 6/2014 | Miller et al. |

(Continued)

FOREIGN PATENT DOCUMENTS

CN     104375578 A     2/2015

OTHER PUBLICATIONS

Ahmed A. Abdelmoaty; "Development of a Hybrid Power Management Unit for Mobile Applications: Solar Energy Case Study"; The American University in Cairo, School of Sciences and Engineering; Jul. 2012.
Yun-Chu Chen, Ming-Chieh Tsai; "Applying Super Capacitors to Avoid the Power Cycling Issue of Solid State Drives"; Department of Electrical Engineering, Tatung University; Dec. 2009.

(Continued)

*Primary Examiner* — Michael J Brown
(74) *Attorney, Agent, or Firm* — White & Case LLP (57) ABSTRACT

Solid-state mass storage devices and methods of operation thereof include a solid-state mass storage device that may have a capacitor-based power supply module configured for providing power to the mass storage device. In one embodiment, the mass storage device has a first mode of operation wherein a primary power supply provided by a host system provides power to the mass storage device sufficient for its operation and provides power to the capacitor-based power supply module to recharge the module, and a second mode of operation wherein power is provided to the mass storage device from both the primary power supply and the capacitor-based power supply module. The mass storage device may be capable of providing power from the capacitor-based power supply module to the mass storage device after a voltage level of the capacitor-based power supply module falls below an under voltage lock out level.

12 Claims, 5 Drawing Sheets

(56) References Cited

U.S. PATENT DOCUMENTS

| | | |
|---|---|---|
| 8,806,271 B2 | 8/2014 | Yong et al. |
| 8,904,161 B2 | 12/2014 | Shin et al. |
| 2010/0332863 A1 | 12/2010 | Johnston |
| 2012/0023351 A1 | 1/2012 | Wakrat et al. |
| 2012/0062187 A1 | 3/2012 | Shim |
| 2012/0117409 A1 | 5/2012 | Lee et al. |
| 2013/0093506 A1 | 4/2013 | Yang et al. |
| 2013/0205065 A1 | 8/2013 | Kloeppner et al. |
| 2014/0146461 A1 | 5/2014 | Choi et al. |
| 2014/0246906 A1* | 9/2014 | Wang ............... H02J 9/061 307/23 |
| 2014/0281151 A1 | 9/2014 | Yu et al. |
| 2016/0077560 A1* | 3/2016 | Stickel ............... G06F 1/266 713/310 |

OTHER PUBLICATIONS

Giddani O.A. Kalcon, Abedelaziz Y. M. Abbas; "Battery Storage System for Frequency Stabilization of AC Networks with High Penetration of Renewable Power"; School of Electrical and Nuclear Engineering; Sudan University of Science and Technology, Khartoum, Sudan; Journal of Science and Technology, vol. 13; ISSN 1605-427X; Dec. 2012.

Woon-Hak Kang, Sang-Won Lee, Bongki Moon, Yang-Suk Kee, Moonwook Oh; "Durable Write Cache in Flash Memory SSD for Relational and NoSQL Databases"; Abstract.

Kwanhu Bang, Kyung-Il Im, Dong-Gun Kim, Sang-Noon Park, Eui-Young Chung; Power Failure Protection Scheme for Reliable High-Performance Solid State Disks; IEICE Trans. Inf. & Syst., vol. E96-D, No. 5, May 2013.

* cited by examiner

ND STATE MASS STORAGE DEVICES
WITH CAPACITOR-BASED POWER SUPPLY
AND METHODS OF OPERATION

BACKGROUND OF THE INVENTION

The present invention generally relates to memory media and technologies for use with computers and other processing apparatuses. The invention particularly relates to solid-state mass storage devices using nonvolatile, solid-state memory components for permanent storage of data and methods of using capacitor-based power supplies thereon.

Nonvolatile, solid-state memory technologies are widely used in a variety of applications, nonlimiting examples including universal serial bus (USB) drives, digital cameras, mobile phones, smart phones, tablet personal computers (PCs), memory cards, and solid-state drives (SSDs). Nonvolatile, solid-state memory technologies used with computers and other processing apparatuses (referred to herein as host computer systems) are currently largely focused on NAND flash memory technologies, with other emerging nonvolatile, solid-state memory technologies including phase change memory (PCM), resistive random access memory (RRAM), magnetoresistive random access memory (MRAM), ferromagnetic random access memory (FRAM), organic memories, and nanotechnology based storage media such as carbon nanofiber/nanotube-based substrates. These and other nonvolatile, solid-state memory technologies will be collectively referred to herein as nonvolatile or solid-state media, memory components, or memory devices.

Mainly for cost reasons, at present the most common solid-state memory components used in SSDs are NAND flash memory components, commonly referred to as flash memory devices, flash memory components, flash-based memory devices, flash-based storage devices, flash-based media, or raw flash. As used herein, the term solid-state mass storage device refers to any device that uses nonvolatile, solid-state memory components for permanent storage of data and has means for providing for interaction between a host computer system and the memory components. A nonlimiting example of a solid-state mass storage device as used herein is a solid-state drive having a host interface for communicating with a host computer system, a memory controller, and an array of nonvolatile solid-state memory components (nonvolatile memory array) accessible by the memory controller for storing data of the host computer system therein.

For reasons of speed and performance, an SSD may include one or more volatile solid-state memory devices (hereinafter, volatile memory devices) for buffering or temporarily storing data intended to be stored on a nonvolatile memory array. In order not to affect performance, the data in the volatile memory devices may be only periodically flushed back to the nonvolatile memory array during operation, and when the solid-state mass storage device is properly shut down. If the power to the SSD were to be suddenly removed, the data in the volatile memory devices that has not yet been flushed to the nonvolatile memory array may be lost and unrecoverable.

Various measures have been implemented in the art to protect important data from being lost in the event of a power failure as described above. For example, an auxiliary power supply may be used to provide backup power in the event of primary power failure. Examples include an onboard battery or capacitor-based power supply located on the substrate (e.g., circuit board) of the SSD and integrated with the circuitry thereof. Typically, the auxiliary power supply (or module) is capable of providing power to the SSD for a time period sufficient for all outstanding data to be written to the nonvolatile memory array, and thereafter allow the memory controller to properly power down without the data potentially being lost.

More recently, supercapacitors have been used as auxiliary power supplies in SSDs. Unlike ceramic capacitors or aluminum electrolytic capacitors, supercapacitors, which include electrical double-layer capacitors (EDLCs), contain no conventional dielectric. Instead, an electrolyte (solid or liquid) ionically connects a pair of electrodes. In an EDLC supercapacitor, an electrical state called "electrical double layer" is defined as a pair of electrons and positive ions or a pair of holes and negative ions formed between an electrode and the electrolyte, and works as a dielectric and gives capacitance. Capacitance is proportional to the surface area of an electrode. Therefore, activated carbon is generally used for electrodes due to its large surface area, and enables supercapacitors to have a relatively high capacitance. The mechanism of ion absorption and desorption to and from the electrode surface contributes to charge and discharge of the supercapacitor. By applying voltage to the facing electrodes, ions are drawn to the surface of the electrode of opposite polarity, and the supercapacitor is charged. Conversely, the ions move away from the electrode surface when the supercapacitor is discharged. This process allows a supercapacitor to be charged and discharged repeatedly.

Supercapacitors located on SSDs are typically limited to being used as auxiliary power supplies for backup power. As such, these supercapacitors are generally not used during the normal operation of the SSD and remain fully charged. For example, U.S. Pat. No. 8,479,032 to Trantham et al. discloses a data-storage device having a power-reservoir circuit with a capacitor acting as an energy-storage device. The capacitor is designed to hold sufficient energy to provide substantially all of the primary operating power to memory devices of an SSD during a minimum time period sufficient to permit transfer of pertinent data from one or more volatile memory devices to one or more nonvolatile memory devices of the SSD. When a power-loss event is detected, power is provided to the memory devices and controllers from the power-reservoir circuit. To accomplish this function, a power-failure switch is used to control whether the primary-operating power is provided from the host-system power source or from the capacitor of the power-reservoir circuit. While not intending to promote any particular interpretation, it appears that the power-failure switch is not capable of providing primary operating power simultaneously from both the host system power source and the capacitor.

Supercapacitors can only provide a portion of their stored power in the event of a host power failure. Specifically, once the supercapacitor's voltage drops below the Under Voltage Lock Out (UVLO) level of the SSD, the supercapacitor can no longer provide power to the SSD and any residual energy within the supercapacitor cannot be extracted and utilized. That is, when the supercapacitor's voltage drops to the UVLO level, a power regulator inside the SSD will typically shut off because the input voltage is lower than a required level.

In view of the above, it can be appreciated that there are certain problems, shortcomings or disadvantages associated with the prior art, and that it would be desirable if a solid-state mass storage device were available that was equipped with a capacitor-based power supply capable of being utilized during the normal operation of the mass storage device and capable of supplying most if not all of its stored power to the mass storage device for a period of time in the event of a failure of the primary power supply.

BRIEF DESCRIPTION OF THE INVENTION

The present invention provides solid-state mass storage devices and methods of operation thereof that are capable of using capacitor-based power supplies to supplement a primary power supply during normal operation of the mass storage devices and/or accessing a larger percentage of energy stored in a capacitor-based power supply than conventional processes.

According to one aspect of the invention, a solid-state mass storage device configured for use with a host computer system and for storing data thereof includes a capacitor-based power supply module configured for providing power to the mass storage device. The mass storage device has a first mode of operation wherein a primary power supply provided by the host computer system provides power to the mass storage device sufficient for the mass storage device to operate and provides power to the capacitor-based power supply module to recharge the capacitor-based power supply module. The mass storage device has a second mode of operation wherein power is provided to the mass storage device from both the primary power supply and the capacitor-based power supply module simultaneously.

According to another aspect of the invention, a solid-state mass storage device configured for use with a host computer system and for storing data thereof includes a capacitor-based power supply module configured for providing power to the mass storage device by discharging energy stored in the capacitor-based power supply module. While discharging, a voltage level of the capacitor-based power supply module falls below an under voltage lock out level of the mass storage device before all of the energy stored in the capacitor-based power supply module has been discharged. The mass storage device is capable of providing power from the capacitor-based power supply module to the mass storage device after the output voltage level of the capacitor-based power supply module falls below the under voltage lock out level.

According to yet another aspect of the invention, a method of operating a solid-state mass storage device configured for use with a host computer system and for storing data thereof includes providing power to the mass storage device from a primary power supply of the host computer system, sensing that a current being used by the mass storage device is above or approaching a preset current level required to operate the mass storage device or sensing that a voltage supplied by the primary power supply is below a first preset voltage level but above a second preset voltage level, and then supplementing the current supplied by the primary power supply with current from a capacitor-based power supply module of the mass storage device such that current from both the primary power supply and the capacitor-based power supply module is being provided to the mass storage device simultaneously.

According to yet another aspect of the invention, a method of operating a solid-state mass storage device configured for use with a host computer system and for storing data thereof includes providing power to the mass storage device by discharging energy stored in a capacitor-based power supply module thereon, wherein a voltage level of the capacitor-based power supply module falls below an under voltage lock out level of the mass storage device before all of the energy stored is the capacitor-based power supply module has been discharged, and continuing to power the mass storage device with the capacitor-based power supply module after the voltage level of the capacitor-based power supply module falls below the under voltage lock out level of the mass storage device such that the mass storage device continues to operate.

Technical effects of the solid-state mass storage devices and methods described above preferably include the capability for efficient usage of capacitor-based power supplies, including supercapacitors. Specifically, certain embodiments preferably provide the ability to use capacitor-based power supplies during the normal operation of a mass storage device in order to supplement the primary power supply thereby reducing the maximum power requirements of the primary power supply necessary to operate the mass storage device, or allowing power supplies with lower maximum power capabilities to be used. In addition, certain embodiments preferably provide the ability to supply most if not all of the stored power to a mass storage device thereby reducing the total capacity requirements of capacitor-based power supplies necessary to sustain the mass storage device.

Other aspects and advantages of this invention will be better appreciated from the following detailed description.

DETAILED DESCRIPTION OF THE INVENTION

Figure 1:
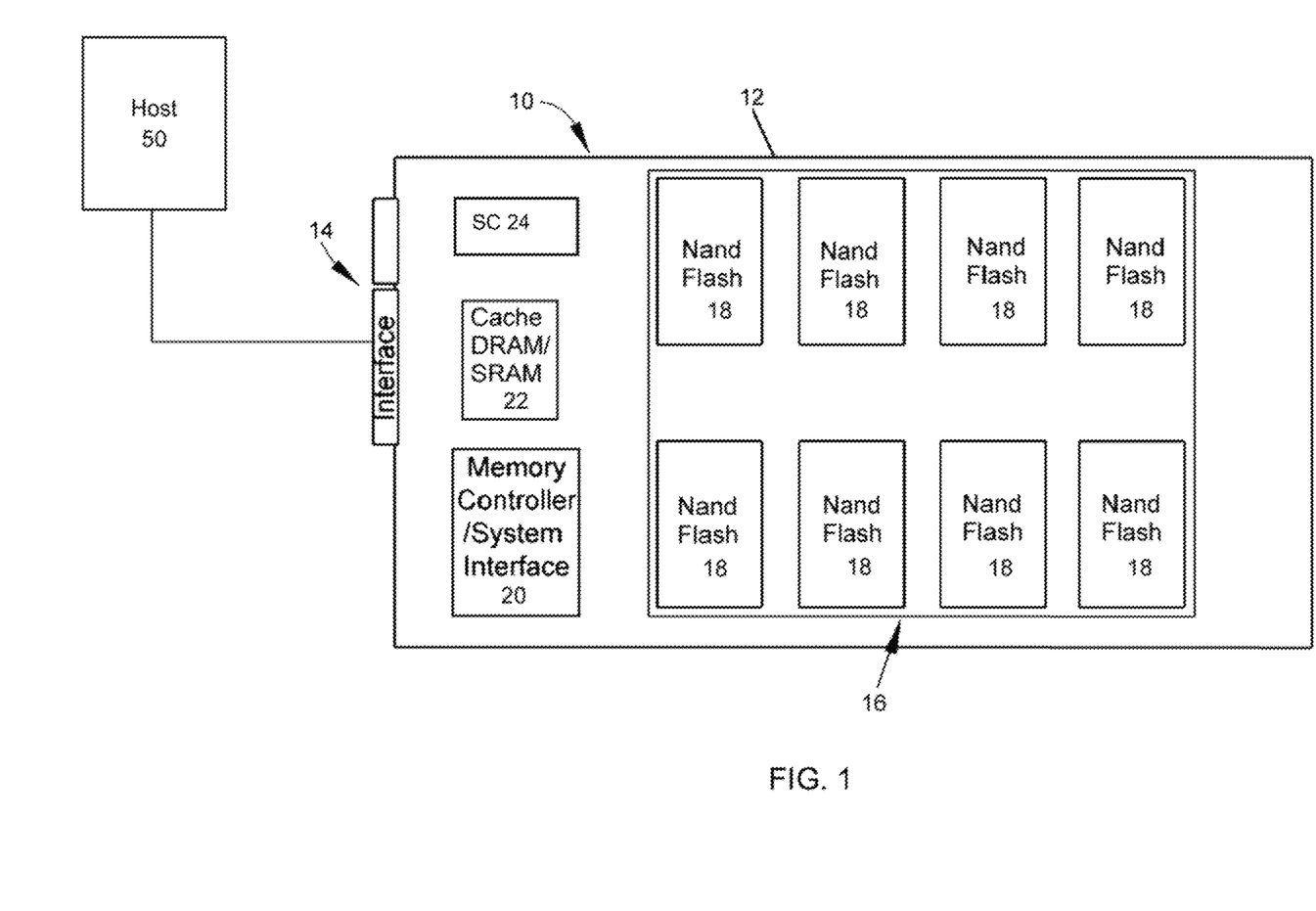
FIG. 1 is a schematic representation of a solid-state drive (SSD) in accordance with certain aspects of the invention.

The current invention is generally directed to the usage of capacitor-based power supplies in solid-state mass storage devices, and includes but is not limited to improving and expanding the usage of supercapacitors in solid-state mass storage devices. FIG. 1 represents a nonlimiting solid-state mass storage device that will be used hereinafter to describe certain aspects of the invention. Although the invention will be explained in reference to NAND flash-based SSDs in general, it will be appreciated that aspects of the invention are equally applicable to other electronic devices that may benefit from using supercapacitors, for example, to allow surges in current demand by the device to be met without having to provide a primary power supply of greater capacity.

FIG. 1 is schematically representative of an exemplary solid-state drive (SSD) 10 containing an array 16 of non-volatile, solid-state memory components (NAND flash) 18. The SSD 10 is represented as being configured as an internal solid-state mass storage device for a computer or other host 50 equipped with a data and control bus for interfacing with the SSD 10. The bus may operate with any suitable protocol in the art, preferred examples being the advanced technology attachment (ATA) bus in its parallel or serial iterations, fiber channel (FC), small computer system interface (SCSI), and serially attached SCSI (SAS).

As known in the art, the SSD 10 is adapted to be accessed by the host 50 with which it is interfaced. In FIG. 1, this interface is through a connector (host) interface 14 of the SSD 10 carried on a drive package that includes a typically printed circuit board 12. Access is initiated by the host 50 for the purpose of storing (writing) data to and retrieving (reading) data from the array 16 of memory components 18, each of the memory components 18 being an integrated circuit (IC) chip carried on the circuit board 12. The memory components 18 are preferably accessed in parallel by a memory controller/system interface (controller) 20, through which data pass when being written to and read from the memory components 18. Protocol signals received through the interface 14 are translated by an abstraction layer of the controller 20 from logical to physical addresses on the memory components 18 to which the data are written or from which they are read. The controller 20 also addresses a volatile memory cache chip 22 integrated on the SSD 10. The cache chip 22 may be, for example, DRAM or SRAM-based, as known in the art. Alternatively, the cache memory of the SSD 10 may be integrated on the controller 20, as also known in the art.

Supercapacitors (also known as ultracapacitors, SDLCs, or super-caps) or other high capacity capacitor devices (such as tantalum capacitors, etc.) are occasionally used in solid-state mass storage devices, such as the SSD 10, as a backup power supply that is capable of powering the mass storage device for a very limited time in the event of a host power failure. However, these supercapacitors are not actively used during the normal operation of the drive, instead being continuously charged to be kept in a fully charged state by the primary power supply of the host 50 (host power supply). Other than being continuously charged, the supercapacitor generally remains unused and does not discharge its stored energy until a host power failure is detected.

Figure 2:
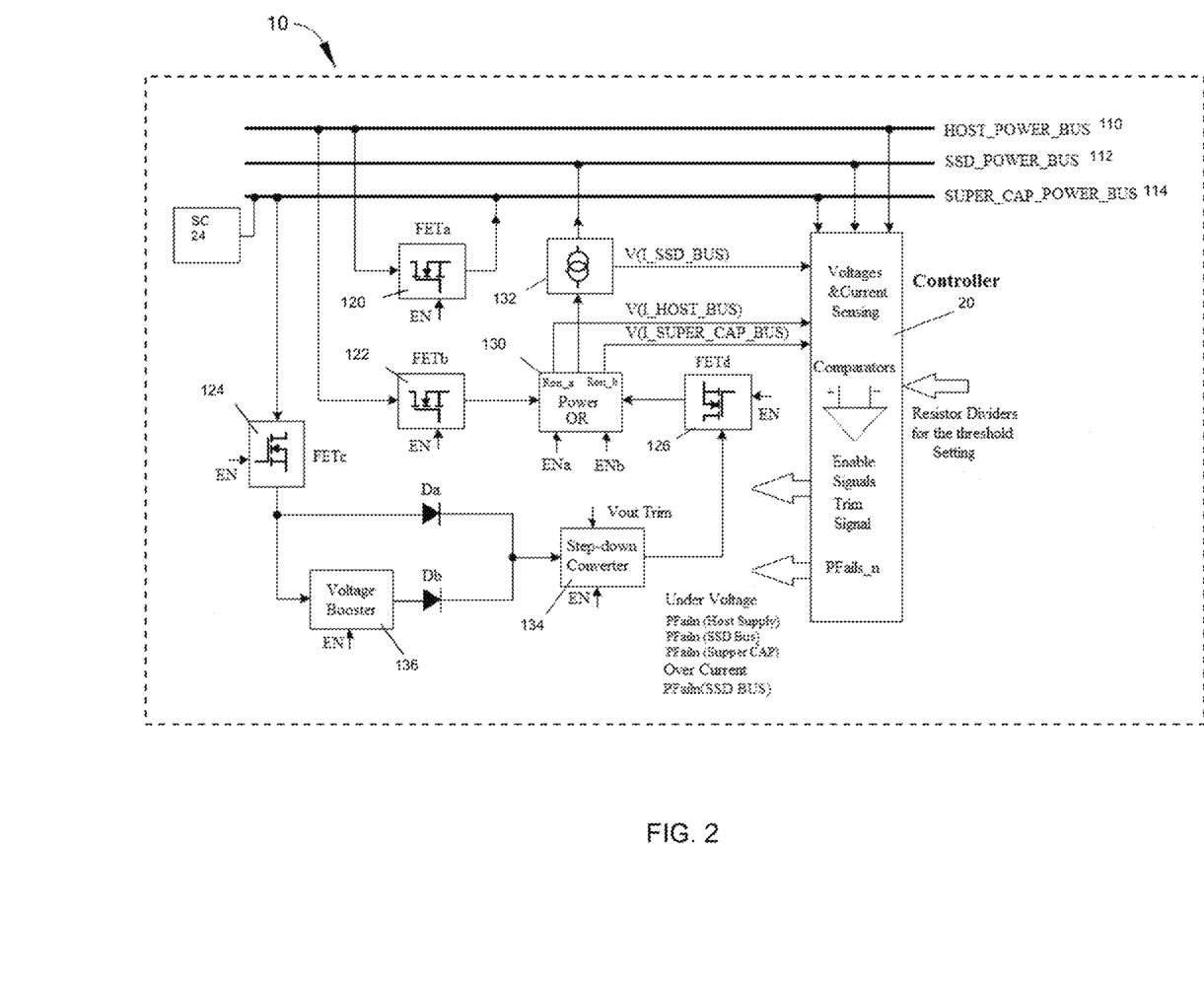
FIG. 2 is a wiring diagram representing a circuit comprising a supercapacitor in a solid-state drive in accordance with a nonlimiting aspect of this invention.

In accordance with an aspect of the invention, the SSD 10 is configured to use a supercapacitor (SC) 24, an EDLC supercapacitor as a nonlimiting example, as a supplemental supply of electrical power that may provide extra power to the SSD 10 during the normal operation of the SSD 10 in addition to the normal power supplied by the primary power supply of the host 50. While the following discussion will make specific reference to the supercapacitor 24, it is within the scope of the invention that other capacitor-based power supplies could be employed. FIG. 2 is a wiring diagram representing a nonlimiting embodiment of the configuration of a portion of the circuitry of the SSD 10 relating to the operation of the supercapacitor 24. The represented portion of the circuitry includes electrical connections between the controller 20, a host power bus 110 (HOST_POWER_BUS) that carries primary power supply from the host 50, an SSD power bus 112 (SSD_POWER_BUS) that carries power to the SSD 10, a supercapacitor power bus 114 (SUPER_CAP_POWER_BUS), and other components related to the operation of the supercapacitor 24.

During the normal operation of the SSD 10, the controller 20 may sense voltage levels of the power buses 110, 112, and 114 and compare the sensed voltage levels to reference voltage levels. For example, a current sensor 132 may measure a current being used or drawn on the SSD power bus 112 (I_SSD_BUS). The current sensor 132 may then produce a voltage proportional to the measured current (V(I_SSD_BUS)) and provide the proportional voltage to the controller 20. Similarly, currents on the host power bus 110 (I_HOST_BUS) and the supercapacitor power bus 114 (I_SUPER_CAP_BUS) may be measured across the Ron resistors of field-effect transistors (FET) on the circuit, such as Ron_a and Ron_b, with additional current sensors (not shown). These measured currents could also be used to produce voltages proportional to the measured current (V(I_HOST_BUS) and V(I_SUPER_CAP_BUS)) that are provided to the controller 20. Based on these sensed current levels, the controller 20 may output control (enable/disable) signals to turn on or off other devices and/or output power failure signals to other devices which may require the power failure information. While the primary power supply of the host 50 is providing a sufficient operating power level to the SSD 10, a first field-effect transistor (FETa) 120 and a second field-effect transistor (FETb) 122 are enabled (EN) by the controller 20 to supply power from the host power bus 110 to the supercapacitor power bus 114 and from the host power bus 110 to the SSD power bus 112 via a Power OR 130 (with ENa enabled and ENb disabled) and current sensor 132.

Figure 3:
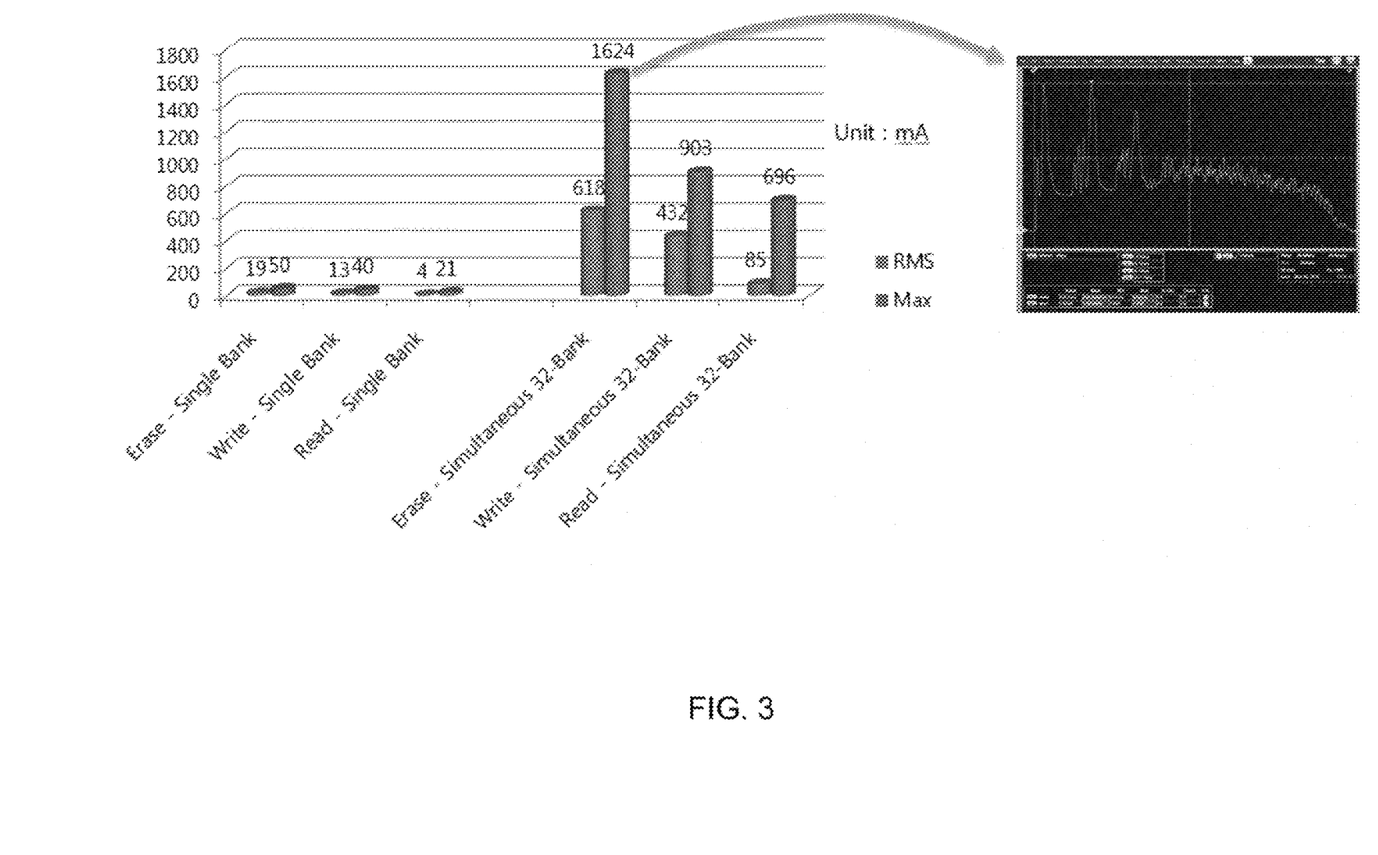
FIG. 3 includes a graph and readings representing NAND flash current demand of a representative SSD while performing various processes.

FIG. 3 represents current demand of a representative SSD for various processes. As shown, current demand of an SSD, such as the SSD 10 discussed above, is not constant during normal operation; rather, the current demand varies depending on the operation being performed by the SSD at a given time. For example, simultaneously erasing memory banks may require about 1.6 A whereas erasing a single memory bank may require no more than about 50 mA. If additional energy is required by the SSD 10 during the normal operation of the SSD 10, for example, at peak load times, power may be provided from the supercapacitor 24. For example, if the controller 20 detects, using the current sensor 132, that the current level of the SSD power bus 112 is momentarily higher than a preset threshold, the controller 20 can immediately disable FETa 120 to disable the charging of the supercapacitor 24, and enable both a third field-effect transistor (FETc) 124 and a step-down converter 134. FETb 122 remains enabled to allow the primary power supply of the host 50 to continue to power the SSD 10. The energy stored in the supercapacitor 24 can then be released through a path comprising a diode (Da) to the step-down converter 134. The controller 20 may trim an output voltage of the step-down converter 134 to match it with the voltage level of the host power bus 110. The controller 20 may further enable a fourth field-effect transistor (FETd) 126 and set a power ORing function of the Power OR unit 130 (enable both inputs ENa and ENb) such that energy discharging from the supercapacitor 24 supplements the power supplied by the primary power supply to the SSD 10.

As an alternative to, or in addition to, measuring the current level of the SSD power bus 112, the controller 20 may detect that the voltage level on the host power bus 110 is approaching or drops below a first preset voltage level ('drooping'), but above a second preset voltage level (indicating host power failure) and infer that the current being drawn by the SSD 10 is exceeding the current capability of the primary power supply of the host 50, causing its output voltage to drop slightly, but not so much as when the host power fails altogether. This mode of operation may continue until the current demand of the SSD power bus 112 drops and returns to a normal level, or until the energy of the supercapacitor 24 is depleted to a predetermined level. Once one of these two events occurs, the controller 20 may disable FETc 124, FETd 126, and the step-down converter 134, set the ORing function of the power OR unit 130 such that power is only provided by the primary power supply (enable ENa and disable ENb), and enable the FETa 120 to begin recharging the supercapacitor.

In view of the above, at peak load times the increased current demand of the SSD 10 may be shared by the primary power supply of the host 50 and the supercapacitor 24. The power OR unit 130 is preferably configured to share the current such that the primary power supply continues to supply its maximum capable current while the supercapacitor 24 supplies additional current to meet the short term peak load. By allowing the SSD 10 to access the energy stored in the supercapacitor 24 during normal operation, the requirements of the primary power supply may be reduced by storing energy in the supercapacitor 24 during low load times and providing extra power from the supercapacitor 24 during times when the SSD 10 momentarily needs extra power for high performance operations, such as simultaneously erasing memory banks.

Figure 4:
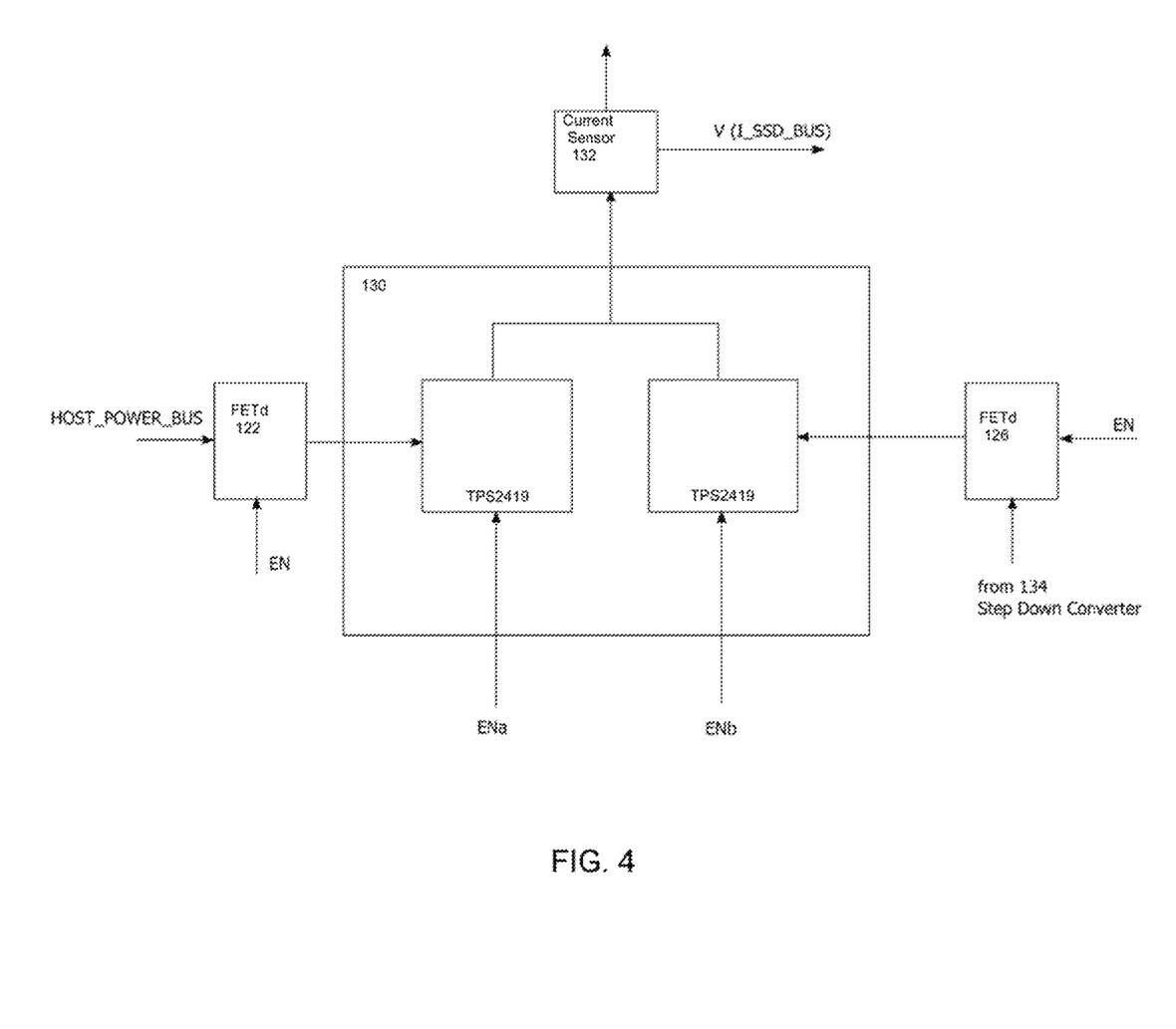
FIG. 4 is a wiring diagram representing internal wiring of a power OR unit in accordance with a nonlimiting aspect of this invention.

FIG. 4 is a schematic representing internal wiring of the power OR unit 130 according to one aspect of the invention. As represented, the power OR unit 130 comprises two field-effect transistors or diodes that may be individually enabled and disabled with control signals ENa and ENb. A nonlimiting example of a power OR unit suitable for use with this invention comprises a pair of N+1 and ORing power rail controllers with enable commercially produced by Texas Instruments under the model number TPS2419.

Preferably, during the normal operation of the SSD 10 the supercapacitor 24 remains charged to a minimum level such that, even if the supercapacitor 24 is used to supplement the primary power supply of the host 50, the supercapacitor 24 is still capable for being used to provide backup power in the event of failure of the primary power supply. The minimum level is preferably sufficient for providing power to the SSD 10 for a time period sufficient for all outstanding data to be written to the array 16 of memory components 18, and thereafter allow the controller 20 to properly power down without loss of data. In the event of a sudden loss of power, such as a failure of the primary power supply of the host 50, the controller 20 may send control signals to disable the FETa 120 and FETb 122, set the power ORing function of the power OR unit 130 such that power is supplied solely from the supercapacitor 24 (disable ENa and enable ENb), and enable the FETc 124, stepdown converter 134 and FETd 126. In this mode of operation, the SSD 10 is preferably powered by the supercapacitor 24 for a limited period of time such that volatile data may be saved to nonvolatile memory media.

Figure 5:
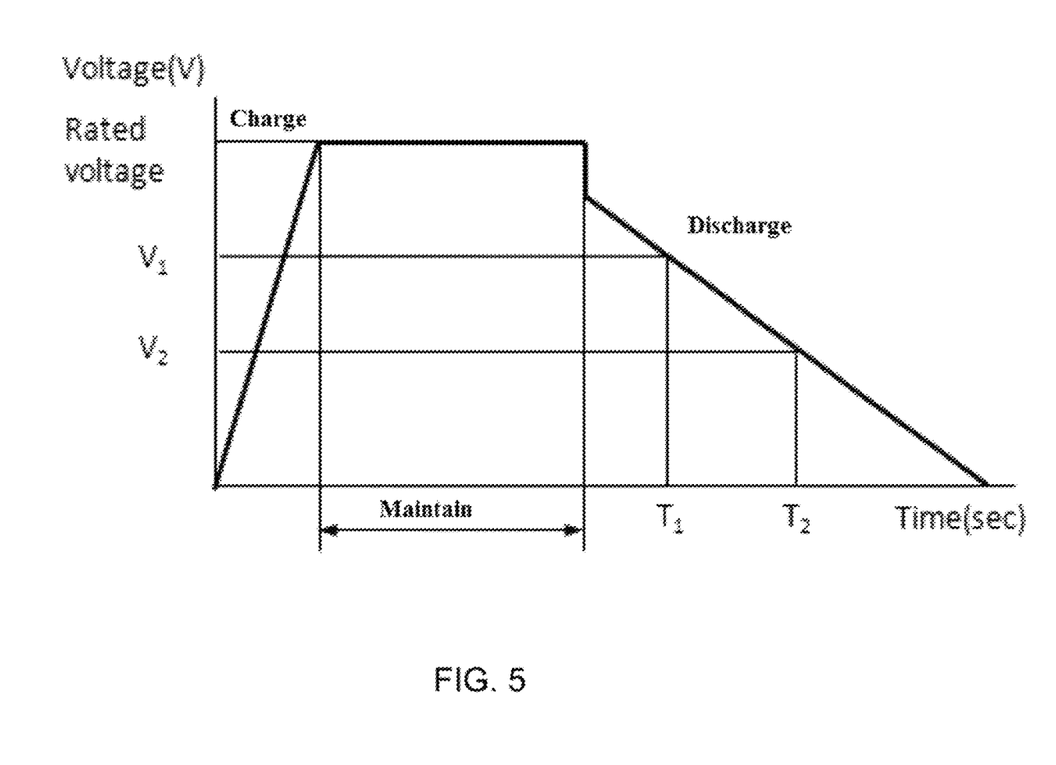
FIG. 5 is a graph representing voltage levels of a supercapacitor during charging, while maintained in a fully charged state, and then while discharging.

While the supercapacitor 24 is discharging, regardless of whether such discharging is to power the SSD 10 during a host power supply failure, to provide supplementary power to the SSD 10, or for any other function, the controller 20 may be configured to ensure that as much of the energy stored in the supercapacitor 24 is discharged as possible. In contrast, conventional SSDs comprising supercapacitors can only discharge and provide a portion of their stored power. FIG. 5 is a graph representing voltage levels of a supercapacitor during charging, while maintained in a fully charged state, and then while discharging. Once the supercapacitor's voltage level drops below an Under Voltage Lock Out (UVLO) level, for example, $V_2$ in FIG. 5, the supercapacitor can no longer provide power to the SSD and any residual energy within the supercapacitor cannot be extracted and utilized. As an example, when the supercapacitor's voltage drops to or below the UVLO level, a power regulator inside conventional SSDs may shut off or disable because the SSD's input voltage is lower than a required level. As such, all remaining energy in the supercapacitor is not extracted and used.

According to an aspect of the invention, the embodiment of FIG. 2 provides that if the controller 20 detects that a voltage level of the supercapacitor 24 drops below a preset level, such as a UVLO level, during the discharging process of the supercapacitor 24, the controller 20 may enable a voltage booster 136 to raise the input voltage of the step-down converter 134 through a path comprising a diode Db until the supercapacitor energy is depleted to an even lower level. Although represented herein as diodes, diodes Da and Db may be power OR units similar to the power OR unit 130. This process follows the previously described supercapacitor discharging process where the FETa 120 has been disabled, the FETc 124, FETd 126, and the step-down converter 134 have been enabled, and the ORing function of the power OR unit 130 has been set such that power is provided from the supercapacitor 24 to the SSD power bus 112 (ENa is disabled and ENb is enabled). As such, immediately prior to enabling the voltage booster 136, the supercapacitor 24 would have been discharging through the path comprising diode Da. This functionality allows the SSD 110 to access more of the stored energy in the supercapacitor 24 than was conventionally possible, and therefore has the potential to reduce a total amount of capacitance required by the SSD 110.

In view of the above, and in accordance with aspects of this invention, solid-state mass storage devices, such as the SSD 10, are preferably capable of using supercapacitors during the normal operation of the mass storage device to supplement the primary power supply of its host and thereby reduce the total load requirements of the primary (host) power supply. Furthermore, solid-state mass storage devices in accordance with aspects of this invention are preferably capable of accessing an increased percentage of the stored energy in the supercapacitors thereby reducing a total amount of capacitance required by the supercapacitors. These features, either individually or together, provide for more efficient energy usage in solid-state mass storage devices.

While the invention has been described in terms of specific embodiments, it is apparent that other forms could be adopted by one skilled in the art. For example, the physical configuration of the SSD 10 or its circuitry could differ from that shown, and materials and processes/methods other than those noted could be used. Therefore, the scope of the invention is to be limited only by the following claims.

The invention claimed is:

1. A solid-state mass storage device configured for use with a host computer system and for storing data thereof, the solid-state mass storage device comprising:
   a capacitor-based power supply configured for providing power to the solid-state mass storage device by discharging energy stored in the capacitor-based power supply, wherein a voltage level of the capacitor-based power supply falls below a predetermined threshold of the solid-state mass storage device before all of the energy stored in the capacitor-based power supply has been discharged;
   a voltage booster for providing power from the capacitor-based power supply to the solid-state mass storage device after the voltage level of the capacitor-based power supply falls below the predetermined threshold.

2. The solid-state mass storage device of claim 1, wherein the voltage booster is configured to increase the voltage supplied from the capacitor-based power supply.

3. The solid-state mass storage device of claim 1, wherein the capacitor-based power supply comprises at least one supercapacitor.

4. The solid-state mass storage device of claim 1, wherein the capacitor-based power supply is configured to provide power to the solid-state mass storage device in response to failure of a primary power supply of the host computer system.

5. The solid-state mass storage device of claim 1, further comprising:
   a first mode of operation wherein a primary power supply provided by the host computer system provides power to the solid-state mass storage device sufficient for the solid-state mass storage device to operate and provides power to the capacitor-based power supply to recharge the capacitor-based power supply; and
   a second mode of operation wherein power to the solid-state mass storage device is simultaneously provided from both the primary power supply and the capacitor-based power supply.

6. The solid-state mass storage device of claim 5, further comprising a controller configured to sense the current being used by the solid-state mass storage device and output a signal indicating which of the first mode of operation or the second mode of operation should be implemented.

7. The solid-state mass storage device of claim 6, further comprising:
   a host power bus for providing power from the primary power supply;
   a solid-state mass storage device power bus for providing power to the solid-state mass storage device; and
   a capacitor power bus for providing power to and from the capacitor-based power supply;
   wherein in the first mode of operation power is transferred from the host power bus to the solid-state mass storage device power bus to provide power to the solid-state mass storage device, and from the host power bus to the capacitor power bus to recharge the capacitor-based power supply; and
   wherein in the second mode of operation power is transferred from both the host power bus and the capacitor power bus to the solid-state mass storage device power bus simultaneously to provide power to the solid-state mass storage device.

8. The solid-state mass storage device of claim 7, wherein the controller is further configured to sense that a current being used by the solid-state mass storage device is above or approaching a preset current level required to operate the solid-state mass storage device or sensing that a voltage supplied by the primary power supply is below a first preset voltage level but above a second preset voltage level, and then signal that the second mode of operation should be implemented.

9. The solid-state mass storage device of claim 1, wherein the capacitor-based power supply is configured to recharge with power from a primary power supply when the voltage supplied by the primary power supply is above a minimum voltage level required to operate the solid-state mass storage device.

10. The solid-state mass storage device of claim 1, wherein the predetermined threshold is an under voltage lock out level.

11. A method of operating a solid-state mass storage device configured for use with a host computer system and for storing data thereof, the method comprising:
   providing power to the solid-state mass storage device by discharging energy stored in a capacitor-based power supply thereon, wherein a voltage level the capacitor-based power supply falls below an under voltage lock out level of the solid-state mass storage device before all of the energy stored in the capacitor-based power supply has been discharged; and
   continuing to power the solid-state mass storage device with the capacitor-based power supply after the voltage level of the capacitor-based power supply falls below the under voltage lock out level of the solid-state mass storage device such that the solid-state mass storage device continues to operate.

12. The method of claim 11, further comprising:
sensing the voltage level of the capacitor-based power supply; and
increasing a voltage supplied from the capacitor-based power supply by enabling a voltage booster when the voltage level falls below or approaches the under voltage lock out level of the solid-state mass storage device.

* * * * *